(12) United States Patent
McNamara et al.

(10) Patent No.: US 8,553,429 B2
(45) Date of Patent: Oct. 8, 2013

(54) ELECTRICAL COMPONENT MOUNTING ASSEMBLIES

(75) Inventors: Niall McNamara, Ballykilty (IE); Brendan Maguire, Ballina (IE); Denis O'Sullivan, Shannon (IE); SeanGearoid McMahon, Ennis (IE); Colm Reidy, Sixmilebridge (IE); Michael Crampton, Shannon (IE)

(73) Assignee: Molex Incorporated, Lisle, IL (US)

( * ) Notice: Subject to any disclaimer, the term of this patent is extended or adjusted under 35 U.S.C. 154(b) by 357 days.

(21) Appl. No.: 12/679,684

(22) PCT Filed: Sep. 24, 2008

(86) PCT No.: PCT/US2008/011059
§ 371 (c)(1),
(2), (4) Date: Oct. 19, 2010

(87) PCT Pub. No.: WO2009/042142
PCT Pub. Date: Apr. 2, 2009

(65) Prior Publication Data
US 2011/0038133 A1    Feb. 17, 2011

Related U.S. Application Data

(60) Provisional application No. 60/975,401, filed on Sep. 26, 2007.

(51) Int. Cl.
*H05K 7/02* (2006.01)
*H05K 7/04* (2006.01)

(52) U.S. Cl.
USPC ............................ 361/810; 361/801; 361/809

(58) Field of Classification Search
USPC ................ 361/728, 752, 760, 796, 800–803, 361/807, 810
See application file for complete search history.

(56) References Cited

U.S. PATENT DOCUMENTS 3,086,070 A    4/1963    Twadell et al.
3,146,384 A    8/1964    Ruehle
(Continued)

FOREIGN PATENT DOCUMENTS

DE    198 29 920 A1    5/1999
DE    100 62 962 A1    7/2002
(Continued)

OTHER PUBLICATIONS

International Search Report for PCT/US2008/011059.

*Primary Examiner* — Hung S Bui
(74) *Attorney, Agent, or Firm* — Larry I. Golden

(57) ABSTRACT

An electrical component mounting assembly is disclosed for attaching a cylindrical electrical component (C1) such as capacitor, diode, or resistor to a mounting member such as a printed circuit board in a horizontal or vertical orientation. The mounting assembly can have a housing (12) and a sleeve (14) placed around the electrical component which cooperates with the housing to retain the electrical component to the housing. A substantially inner cylindrical wall (32) of the housing can taper inward from an entrance (34) end to a rear wall (18) to form a tapering or narrowing chamber (30). The sleeve can have a slit that runs along the entire length of the sleeve and a tapered outer surface (28) that cooperates with the tapered chamber to clamp or compress against the electrical component as the sleeve is inserted into the housing. The lack of appreciable expansion of the housing creates a tight friction fit to secure the sleeve to the housing. The sleeve can also include a plank that is received in an opening in the housing which can be heat staked to reinforce the friction fit taper lock between the housing and sleeve. The housing can be dimensioned to mount more than one electrical component diameter size by varying the dimensions of the sleeve, and in particular the thickness of sleeve.

15 Claims, 6 Drawing Sheets

(56) References Cited

U.S. PATENT DOCUMENTS

| | | | |
|---|---|---|---|
| 5,311,097 A * | 5/1994 | Mepham et al. | 313/51 |
| 5,707,249 A * | 1/1998 | Byrd | 439/500 |
| 7,791,901 B2 * | 9/2010 | Sailor et al. | 361/807 |
| 8,192,212 B2 * | 6/2012 | Casses et al. | 439/181 |
| 8,216,178 B2 * | 7/2012 | Thommen | 604/74 |
| 2012/0077356 A1 * | 3/2012 | Shimizu et al. | 439/55 |

FOREIGN PATENT DOCUMENTS

| | | |
|---|---|---|
| JP | 62-47184 | 3/1987 |
| JP | 10-208983 | 8/1998 |

* cited by examiner

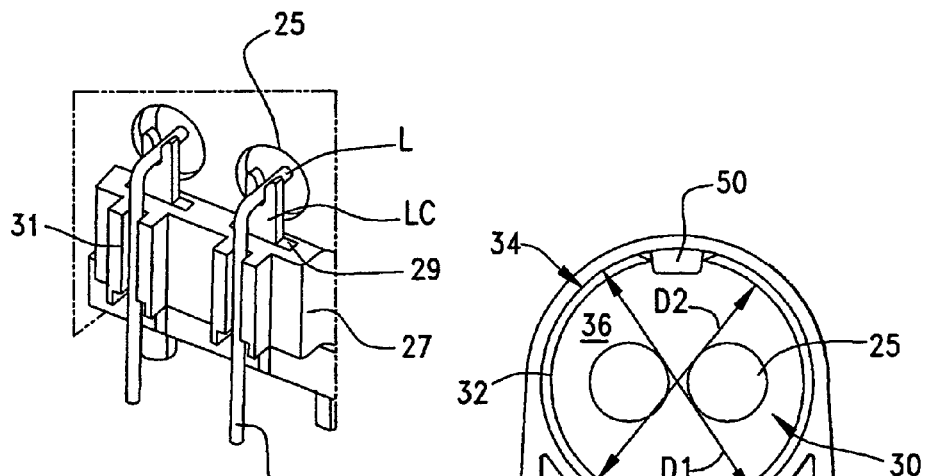
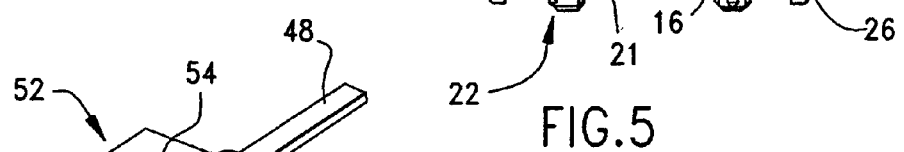
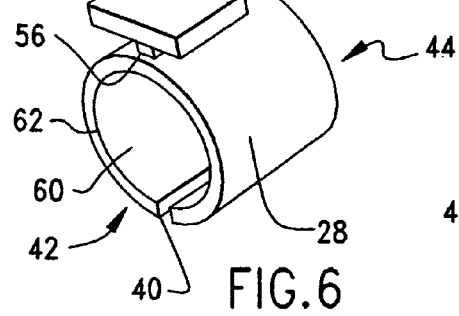
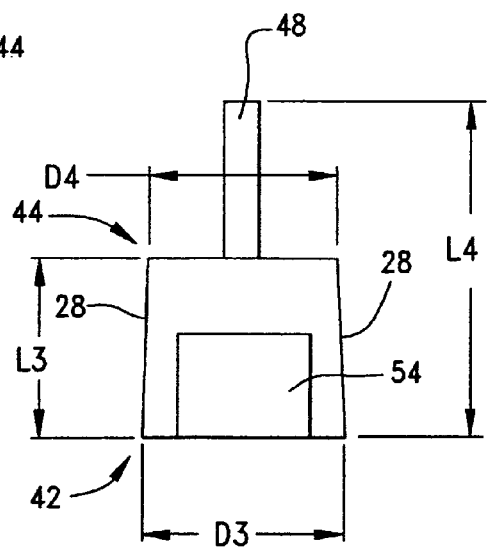
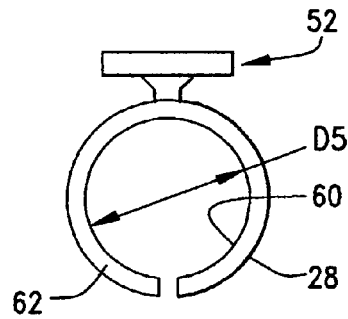
FIG.4
FIG.5
FIG.6
FIG.7
FIG.8

ELECTRICAL COMPONENT MOUNTING ASSEMBLIES

BACKGROUND OF THE INVENTION

The present disclosure is generally directed to electrical component mounting assemblies for securely mounting an electrical component such as a capacitor, diode or resistor to a printed circuit board (PCB) or to another mounting member. In particular, the present disclosure is directed to a mounting assembly having a sleeve for receiving a cylindrical electrical component, a housing having a cylindrical chamber that cooperates with the sleeve to securely retain the cylindrical electrical component therein and mounting posts for mounting the housing to a PCB or other mounting member. More specifically, a mounting assembly is disclosed herein that has a housing with a base and a tapered chamber for receiving therein one of a plurality of unique diameter electrical components having a sleeve substantially surrounding each electrical component, typically wherein the housing is mounted to a PCB such that the base of the housing is elevated above the PCB. Each sleeve is dimensioned to receive one of the unique diameter electrical components and can accommodate some deviations of the diameter of the electrical component, and the cooperation of the tapered sleeve and tapered chamber securely retains the electrical component to the housing.

Electrical components such as capacitors, diodes, resistors and the like are typically mounted directly to PCBs by connecting the leads of the electrical component to the PCB through soldering and the like. In some circumstances, such mounting is not feasible. In particular, some PCBs are placed in tight surroundings that restrict capacitors from being mounted in a vertical orientation. In addition, certain environments such as high vibration environments found in the automotive and/or avionic industries require more robust mounting of the capacitor to the PCB. Furthermore, it may be desirable to avoid soldering the electrical component to the PCB and instead use compliant push pin terminals to connect the component to the PCB.

In some applications, cylindrical electrical components such as electrolytic capacitors are mounted via a housing that has a chamber to receive one of the electrical components. These housings are typically mounted directly to or flush against the PCB and have openings to allow the passage of the leads of the electrical component for electrical connection to the PCB. As cylindrical electrolytic capacitors can come in various diameters and lengths, these applications typically require a separate housing for each unique diameter and length component. Also, mounting of these types of housings occupies more space on the PCB which is a valuable commodity. Additionally, some of these applications use an epoxy to retain capacitors to the housing and to prevent dislodgement of the capacitors from the housings due to environmental effects such as vibration, thermal expansion and contraction or deviations in the diameter and/or length of the capacitor.

When direct mounting of a cylindrical electrical component in vertical orientation to a PCB is not feasible, when solderless connection is desired, or when a low profile assembly is required with limited component mounting space on the PCB, the electrical component mounting assemblies described herein can provide advantages over previously known electrical component mounting arrangements. Cylindrical electrical component mounting assemblies of the present disclosure can include a housing with a chamber for receiving a cylindrical electrical component in a horizontal or vertical orientation and have at least two posts for mounting the housing to the PCB in a predetermined raised position above the surface of the PCB or flush against the PCB. The electrical component mounting assemblies disclosed herein secure the electrical component to the housing without the use of epoxy or other adhesive compounds through use of a cooperating tapered sleeve and a tapered housing chamber. The sleeve can have a passage or opening extending the length of the sleeve, and the sleeve can be dimensioned to accept electrical components having a common diameter. The sleeve can exhibit resilient closeability both to accommodate variation or deviation in the electrical component's diameter and to compress about the electrical component to retain it within the housing.

In keeping with the present disclosure, the electrical component mounting assemblies can reduce the complexity of having a different housing for every differently sized electrical component by providing one housing that can secure electrical components having different diameters and their associated sleeves. In other words, electrical mounting assemblies as described herein can have a housing that securely accepts one of a plurality of unique diameter electrical components and their associated sleeves. The housing can also include a terminal support structure for supporting termination contacts for electrically connecting the leads of the electrical component to the PCB. The termination contacts can be selected from those requiring soldering to both the leads and the PCB or those having mechanical solderless connection to one or both the leads and the PCB.

SUMMARY OF THE INVENTION

In one aspect of the present disclosure an electrical component mounting assembly for mounting any one of a plurality of cylindrical electrical components to a mounting member with each electrical component having a unique diameter is provided. The electrical component mounting assembly comprises a sleeve for each unique diameter cylindrical electrical component and a housing having a tapered chamber dimensioned to accept one of a plurality of unique diameter cylindrical electrical components received within their associated sleeves. The sleeve has an inner surface defining a substantially cylindrical opening for snugly receiving the unique diameter cylindrical electrical component and an outer surface tapered inward from a first end to a second end and the tapered chamber has an entrance end having a diameter greater than the diameter of a back end; wherein progressive insertion of the second end of the sleeve through the entrance end and into the tapered chamber causes the sleeve to compress against the unique diameter cylindrical electrical component and to frictionally retain the unique diameter cylindrical electrical component and its associated sleeve to the housing.

In another aspect of the present disclosure a capacitor mounting assembly for mounting any one of a plurality of uniquely diametered capacitors to a PCB is provided. The capacitor mounting assembly comprises a sleeve for each uniquely diametered capacitor and a housing having a tapered chamber dimensioned to separately accept a plurality of uniquely diametered capacitors and their associated sleeves. The sleeve has an inner surface defining a substantially cylindrical opening for snugly receiving the uniquely diametered capacitor and an outer surface tapered inward from a first end to a second end. The tapered chamber has an entrance end having a diameter greater than the diameter of a back end; wherein progressive insertion of the second end of the sleeve through the entrance end and into the tapered chamber causes the sleeve to compress against the uniquely diametered capacitor and to frictionally retain the uniquely diametered capacitor and its associated sleeve to the housing.

In yet another aspect of the present disclosure, an electrical component mounting assembly for mounting an electrical component to a mounting member is provided. The electrical component mounting assembly comprises a tapered sleeve having a first end wider than a second end and defining an opening for snugly receiving an electrical component therein and a housing having a tapered chamber for accepting the sleeve and electrical component. The tapered chamber has a entrance end and back end opposite to the entrance end and the entrance end is wider than the back end; wherein progressive insertion of the narrow end of sleeve through the entrance end and into tapered chamber causes the sleeve to compress against the electrical component and to frictionally retain the sleeve and electrical component to the housing.

In yet another aspect of the present disclosure an electrical component holder for fastening an electrical component to a mounting member having a plurality of receiving openings therein is provided. The electrical component holder comprises a housing having a generally cylindrical retention area with the retention area having a generally cylindrical body portion extending around a central axis and a generally flat base along one side of the body portion. The housing has an open front end to receive the electrical component and an opposite back end. The electrical component holder also comprises a plurality of support members extending from the base. The support members each have an insert portion to be received within a respective receiving opening in the mounting member and a spacer portion between the insert portion and the retention area for spacing the retention portion a predetermined distance above the mounting member when the insert portions are received within the receiving openings in the mounting member. The spacer portions are spaced apart to provide a component retention area below the base wherein additional components can be mounted to the PCB below the retained capacitor.

In yet another aspect of the present disclosure a method of mounting an electrical component to a mounting member is provided. The method comprises the steps of inserting the electrical component in a passage defined by an inner surface of a sleeve having an outer surface tapered inward from a first end to a second end; inserting the sleeve having the electrical component received therein, second end first, into a tapered chamber of a housing to engage a friction fit taper lock between the tapered outer surface of the sleeve and the tapered chamber with the tapered chamber narrowing from an entrance end to a back end; and inserting a plurality of posts of the housing into respective receiving openings of the mounting member.

Other aspects, objects and advantages of the present disclosure will be understood from the following description according to the illustrated embodiments of the present disclosure, specifically including stated and unstated combinations of the various features which are described herein and relevant information which is shown in the accompanying drawings and examples.

BRIEF DESCRIPTION OF THE DRAWINGS

FIG. 4 is a perspective view of the rear wall of the housing of the electrical component assembly shown in FIG. 1 showing lead extensions supported in extension clips of the termination support shelf.

FIG. 5 is an elevation view of the front end of the housing of the electrical component mounting assembly shown in FIG. 1.

FIG. 6 is a perspective view of the sleeve of the electrical component mounting assembly of FIG. 1.

FIG. 7 is an elevation view of a top side of the sleeve shown in FIG. 6.

FIG. 8 is an elevation view of a front end of the sleeve shown in FIG. 6.

DETAILED DESCRIPTION OF THE INVENTION

As required, detailed embodiments of the present disclosure are provided herein; however, it is to be understood that the disclosed embodiments are merely exemplary of the disclosure, which may be embodied in various forms. Therefore, specific details disclosed herein are not to be interpreted as limiting, but merely as a basis for the claims and as a representative basis for teaching one skilled in the art to variously employ the inventive features herein disclosed in virtually any appropriate manner.

Figure 1:
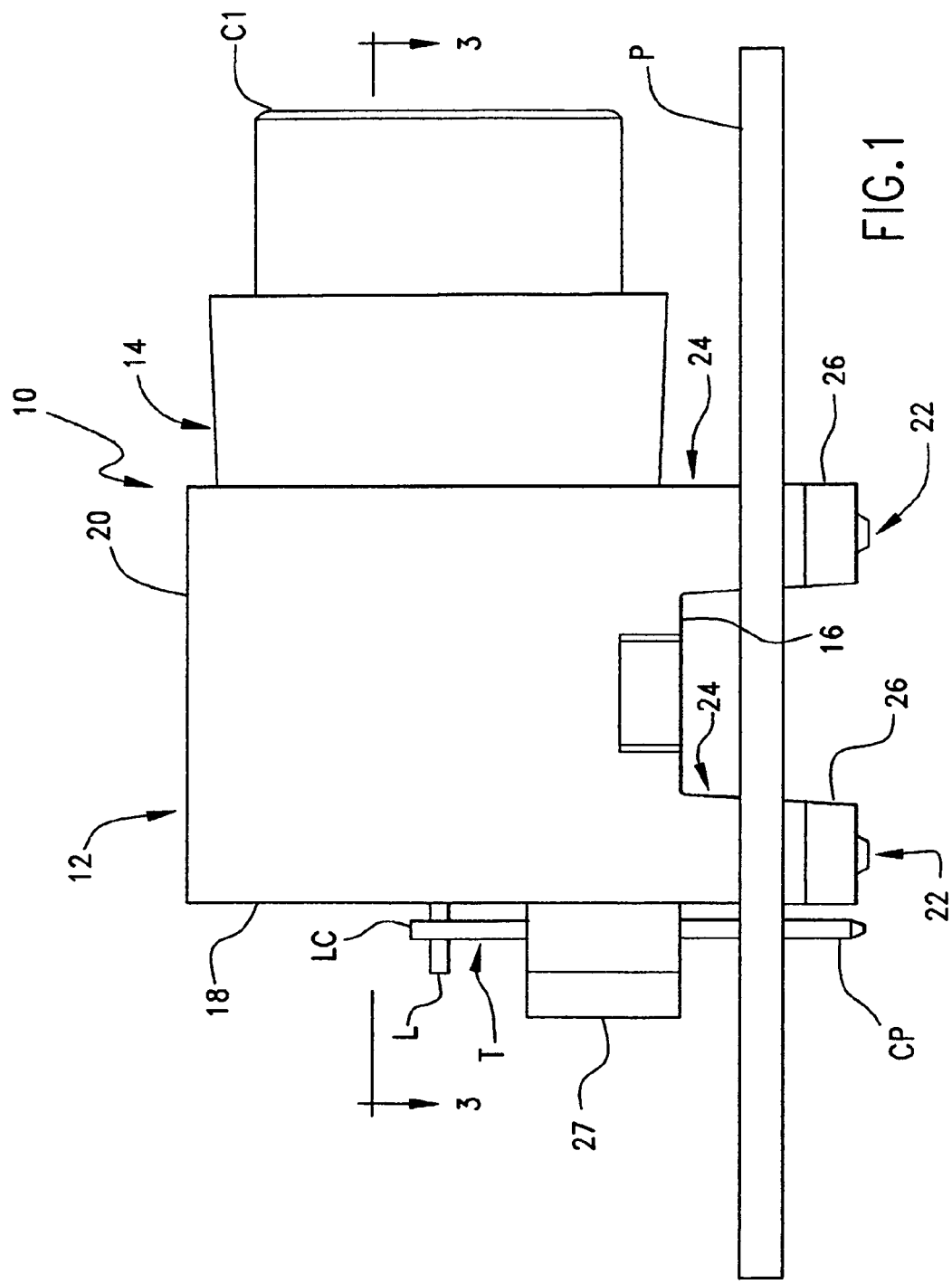
FIG. 1 is an elevation view of one embodiment of the electrical component mounting assembly of the present disclosure mounted to a PCB.
Figure 2:
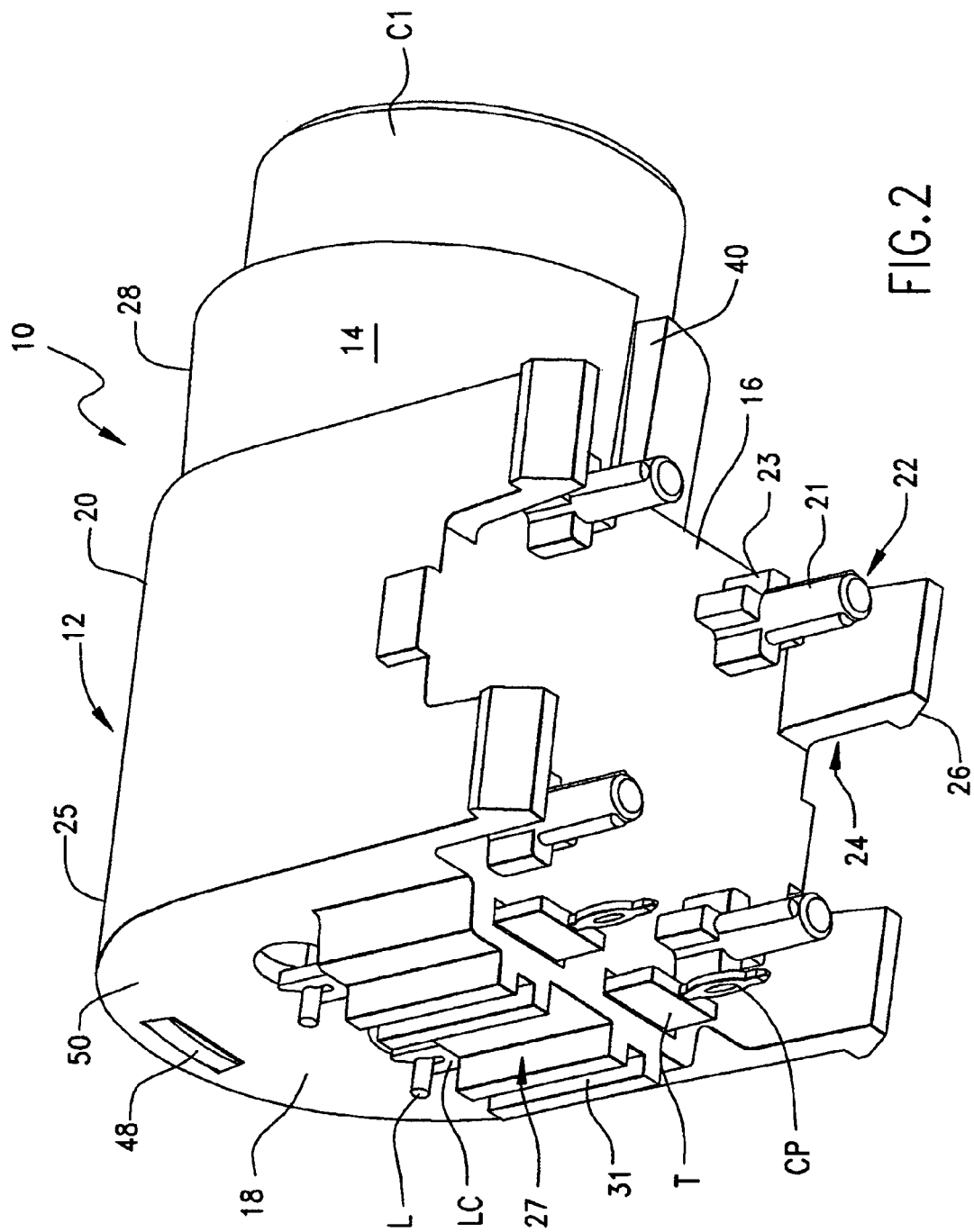
FIG. 2 is a perspective view of the electrical component mounting assembly shown in FIG. 1.

FIG. 1 illustrates one embodiment of electrical component mounting assembly 10 of the present disclosure for attaching a cylindrical electrical component such as capacitor "C1" to PCB "P". While mounting assembly 10 will be shown mounting capacitor "C1" in all the following illustrations it will be understood that mounting assembly 10 can mount other cylindrical electrical components such as diodes, resistors, transistors and the like and that the mounting can be made to a PCB as illustrated or to some other mounting member. Mounting assembly 10 can have housing 12 and sleeve 14 placed around a capacitor "C1" which cooperates with housing 12 to retain capacitor "C1" to housing 12. Capacitor "C1" is mounted to PCB "P" in a longitudinal orientation that is horizontal as illustrated in FIG. 1. It will be understood that housing 12 can mount an electrical component in a vertical orientation as well. As shown in FIGS. 1 and 2, housing 12 can have base wall 16, rear wall 18 extending substantially perpendicularly to base wall 16, and substantially cylindrical body portion 20. Housing 12 can have posts 22 and latching bars 24, all of which can extend downward from base wall 16. Posts 22 and latch bars 24 can be received in appropriately dimensioned holes (not shown) in PCB "P" for mounting housing 12 to PCB "P" such that base wall 16 is raised above PCB "P", as shown in FIG. 1.

Latching bars 24 provide "press fit" locking to PCB "P", and for reinforced mounting or instead of mounting the assembly 10 with latch bars 24, insertion portions 21 of posts 22 can be heat staked to PCB "P" using known methods. Between base wall 16 and insertion portion 21 of posts 22 can be spacer portions 23. Typically, each spacer portion 23 has a wider profile than insertion portion 21 that operates as a stop surface against PCB. Alternatively, posts 22 can have a stop surface to engage PCB to elevate base wall 16 from PCB. Insertion portions 21 can be inserted through holes (not shown) of PCB board only up to spacer portions 23. This effectively raises base wall 16 above PCB board. The spacer portions can be dimensioned to permit a desired elevation of the housing to allow either additional components to be mounted under housing 12 or to allow circuit traces to run beneath housing 12. The raised horizontal positioning of the capacitor, as described, provides a generally low-profile design which also increases available PCB mounting space for component placement. Alternatively, housing 12 can be mounted such that base wall 16 is flush against PCB which permits an even lower profile but does not provide the intermediate space for additional components or circuit traces.

Hook portion 26 of latching bars 24 can be positioned slightly below spacer portions 23 so that when housing 12 is pushed against PCB "P" latch bars 24 can lock to PCB "P" before spacer portions 23 contact PCB "P". The vertical distance between hook portion 26 and spacer portions 23 can determine the degree of vertical movement of housing 12 relative to PCB "P". Alternatively, housing 12 can be mounted to PCB "P" only by heat staking posts 22 to PCB "P" or only with latch bars 24. While housing 12 shown in FIGS. 1 and 2 has four posts 22 and four latch bars 24, housing 12 can have two or more posts 22, two or more latch bars 24, or one or more of each of post 22 and latch bar 24.

Figure 3:
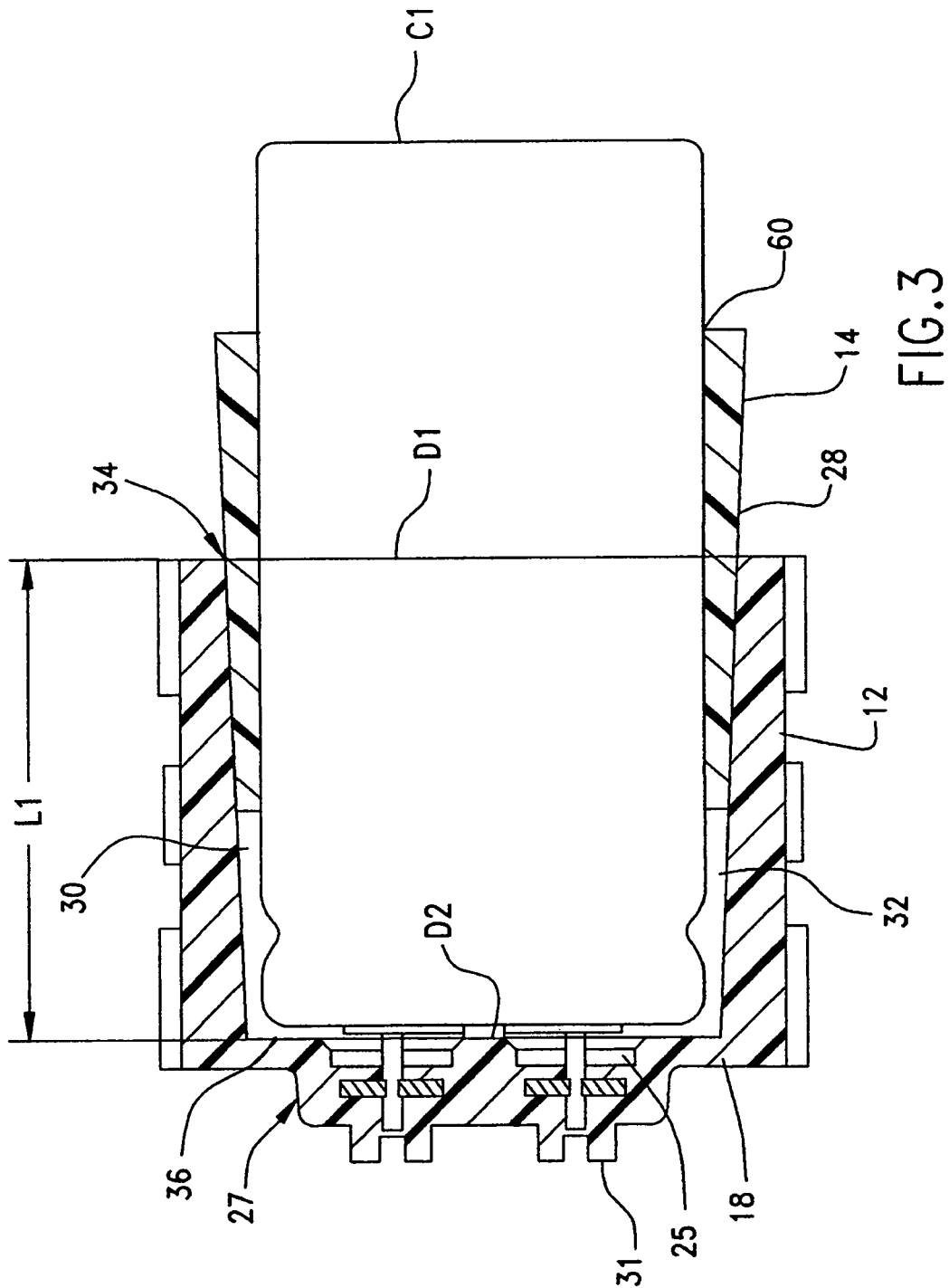
FIG. 3 is a cross-sectional view of the electrical component mounting assembly shown in FIG. 1 taken at line 3-3.

Rear wall 18 can have two apertures 25 for allowing leads "L" to exit housing 12 when capacitor "C1" is inserted into housing 12 as shown in FIGS. 2 and 3. Alternatively, one larger aperture can be used. Termination support shelf 27 shown in FIG. 2 can extend from rear wall 18 and can include one or more terminal slots 29 for receiving terminal connectors "T" having compliant push pins "CP" at one end for solderless press-fit type electrical connection to the PCB "P" and lead clips "LC" at an opposite end for connection with the exiting leads "L". Termination support shelf 27 can also have one or more extension clips 31. Extension clips 31 can support lead extensions "LE" (see FIG. 12) which can be soldered to leads "L" of capacitor "C1" and to PCB "P" to electrically connect capacitor "C1" to the PCB. Alternatively, a mechanical connection can be used to connect leads "L" to lead extensions "LE". As shown in FIG. 4, lead clip "LC" held in slot 29 can support and electrically connect leads "L" of capacitor "C1" to lead extension "LE".

Housing 12 can be modified to mount an electrical component in a vertical orientation by repositioning posts 22 relative to substantially cylindrical body portion 20 such as having substantially cylindrical body portion 20 extend in parallel orientation to posts 22 and/or latch bars 24 as opposed to perpendicular orientation shown in FIG. 1. Also, if utilized, terminal connectors "T" may be altered such that push pins "CP" extend in parallel relation to leads "L".

Referring to FIGS. 3 and 5, housing 12 can have a substantially cylindrical tapered retention area or chamber 30 to receive capacitor "C1". Inner cylindrical wall 32 of housing 12 can taper inward from entrance 34 to interior surface 36 of rear wall 18 to form tapering or narrowing chamber 30. As a result, entrance diameter "D1" of chamber 30 at entrance 34 is greater than interior diameter "D2" of chamber 30 at interior surface 36 of rear wall 18.

Sleeve 14 can have tapered outer surface 28 that cooperates with tapered chamber 30 to clamp or compress against capacitor "C1" as sleeve 14 is inserted into housing 12 to hold capacitor "C1", which is retained in sleeve 14, within housing 12 as shown in FIG. 3. The lack of appreciable expansion of housing 12 creates a tight friction fit of sleeve 14 to housing 12 to retain sleeve 14 in housing 12. Moving to FIGS. 6, 7 and 8, slot 40 can extend from outside end 42 to insertion end 44 of sleeve 14. Slot 40 and the material of the sleeve cooperate to provide flexibility or resilient closeability to the sleeve and allows sleeve 14 to clamp against capacitor "C1". The cooperating taper of sleeve 14 and tapered chamber 30 increases the clamping force of sleeve 14 against capacitor "C1" as sleeve 14 progresses into chamber 30.

The degree of tapering of outer surface 28 and chamber 30 can be balanced between providing sufficient surface contact of outer surface 28 and chamber 30 to produce the desired retaining force and the ability to retain a desired range of electrical components having different diameters. In general, it will be understood that the closer the tapering of the outer surface 28 and chamber 30 match each other, the greater the amount of surface contact. In one embodiment, the degree of tapering of the outer surface 28 is the same as the degree of tapering of chamber 30. In another embodiment, chamber 30 and outer surface 28 can each taper from between about 0.5 degrees to about 5 degrees. In yet another embodiment, chamber 30 and outer surface 28 can each taper from about 1 degree to about 3 degrees. In the illustrated embodiments, chamber 30 and outer surface 28 both can taper about 2 degrees from the axis of the chamber 30 and sleeve 14, respectively.

Housing 12 and sleeve 14 can each be made from the same or from different materials. Thermoplastic materials are typically utilized. In one embodiment both housing 12 and sleeve 14 are constructed of polyamide material such as nylon PA6 30% glass-filled material. While having the sleeve 14 and housing 12 constructed from the same material is not necessary, this arrangement benefits from having a more uniform thermal expansion or contraction which can reduce the risk of loosening the taper lock frictional attachment of the sleeve 14 to the housing 12. Also, having sleeve 14 and housing 12 be uniformly tapered provides a uniform cross-sectional thickness for consistent expansion/contraction which may be caused by temperature change.

Continuing with FIGS. 6, 7 and 8 sleeve 14 can have plank 48 extending from insertion end 44 at a side opposite slot 40. Plank 48 is dimensioned to extend through slot 50 in rear wall 18 of housing 12 when sleeve 12 is inserted into housing 12. Plank 48 can be heat staked as shown in FIG. 2 to reinforce the friction fit retention of sleeve 14 to housing 12. Heat staking can be accomplished by known methods.

Sacrificial key 52 can extend from outer surface 28. As will be described in the assembly process below, sacrificial key 52 can be used to pick and place sleeve 14 during the process of fastening capacitor "C1" to sleeve 14 and housing 12 and is removed after assembly. Sacrificial key 52 can have a head portion 54 and a neck portion 56 attaching head 54 to outer surface 28.

Tapered outer surface 28 can taper inward from outside end 42 to insertion end 44 as shown in FIG. 7. This results in outer diameter "D3" measured at outer surface 28 at outside end 42 being greater than outer diameter "D4" measured at outer surface 28 at insertion end 44. As shown in FIG. 8, inner diameter "D5" measured at inner surface 60 of sleeve 14 can be substantially the same at both insertion end 44 and outside end 42 to provide a substantially uniform cylindrical receiving opening or passage. This uniform cylindrical receiving opening is also shown in FIG. 3. It is understood that having a uniform cylindrical receiving opening or uniform diameter "D3" and a tapered outer surface 28 results in sleeve wall 62 being thicker at outside end 42 than at insertion end 44.

Since different capacitors or other cylindrical electrical components can have different diameters, sleeve 14 can be dimensioned specifically for each capacitor diameter. In other words, each capacitor having a unique diameter can be fastened to housing 12 using sleeve 14 having dimensions specifically for that unique diameter capacitor. The length of the capacitor or other electrical component however may not affect the dimensions of the sleeve 14, particularly if these electrical components have standard as opposed to custom lengths. Inner diameter "D5" can be manufactured to be slightly less than the capacitor to be retained. Slot 40 allows sleeve 14 to open and accept the electrical component, and due to the resilient closeability of the sleeve material, the electrical component can be held firmly in sleeve 14. In one embodiment, "D5" can be from about 1% to about 20% less than the diameter of the electrical component to be retained. In another embodiment "D5" can be from about 3% to about 15% less than the diameter of the electrical component to be retained.

Housing 12 typically is dimensioned to mount more than one capacitor or other electrical component diameter size. Chamber 30 can be dimensioned to securely retain the largest diameter electrical component desired to be mounted to PCB "P" by cooperation of chamber 30 and the particular electrical component's associated sleeve 14 as described above. In order to mount other smaller diameter electrical components, the dimensions of sleeve 14 can be varied to securely retain such components in chamber 30. In particular, the dimensions of sleeve 14 can be varied by reducing inner diameter "D5" according to the diameter of the electrical component to be retained as described above and the thickness of wall 62 can be increased such that outer surface 28 and tapered chamber 30 cooperate as described above. Generally, housing 12 can be dimensioned to securely retain the largest diameter electrical component by making diameter "D1" greater than diameter "D4" of the largest component diameter sleeve 14 but less than diameter "D3", and diameter "D2" can be less than diameter "D4".

There may be certain circumstances when it is desirable to have a single housing 12 mount less than all of the various diameter electrical components. In other words, multiple housings 12 can be used to accommodate all the various sizes of electrical component diameters. With respect to capacitors for example, the lengths of some of the capacitors to be mounted make having only one housing 12 mount them all impractical because some capacitors may extend either too far out of or to far into the housing for the desired application. Another example may be that having all housings 12 dimensioned for the largest diameter capacitor to be mounted may take up more space on the PCB than necessary, especially when there are a greater number of smaller diameter capacitors than larger diameter capacitors.

Figure 9:
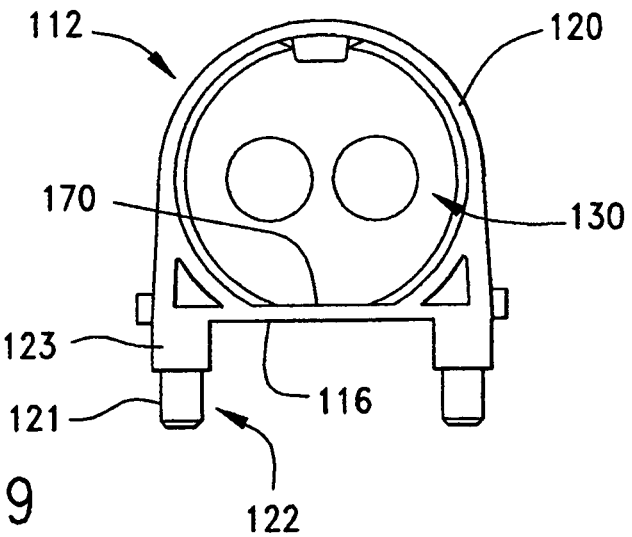
FIG. 9 is an elevation view of a front end of another embodiment of a housing of the electrical component mounting assembly of the present disclosure.
Figure 10:
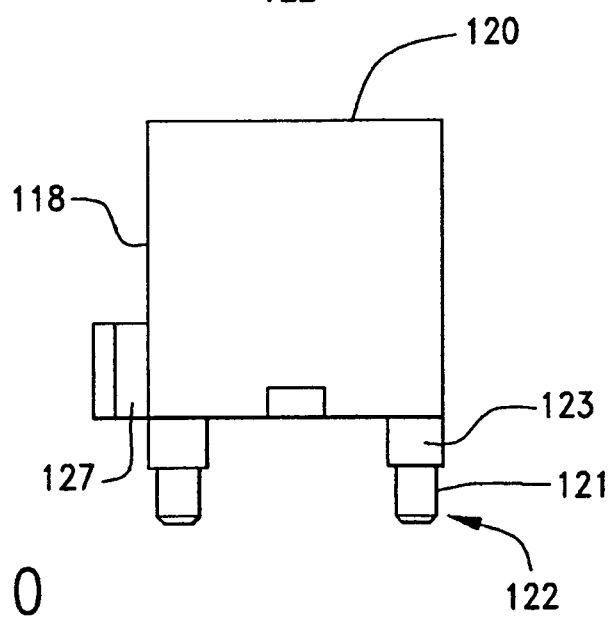
FIG. 10 is an elevation view of the side of the housing shown in FIG. 9.

In one embodiment, housing 12 is dimensioned to securely retain and to mount either of two capacitors having two different diameters to the PCB "P". For example, housing 12 can be dimensioned to securely retain 16 mm and 18 mm diameter capacitors having a length that ranges from 15 mm to 40 mm, or to retain 10 mm and 12.5 mm diameter capacitors having a length that ranges from 12.5 mm to 25 mm. In the 10 mm and 12.5 mm diameter example, housing 12 can have diameter "D1" of about 15.2 mm, diameter "D2" of about 14.1 mm. The length of the tapered chamber 30 "L1" from entrance 34 to interior surface 36 of rear wall 18 shown in FIG. 3 can be 13.6 mm and chamber 30 can taper at an angle of about 2 degrees. The following dimensions of sleeve 14 for each of the 10 mm and 12.5 mm capacitors are the same except for diameter "D5" which can be about 9 mm for 10 mm diameter capacitors and about 11.5 mm for 12.5 mm diameter capacitors. Length "L3" of sleeve 14 from outside end 42 to insertion end 44 can be about 14 mm, length "L4" of sleeve 14 including plank 48 can be about 26.3 mm For the 16 mm and 18 mm example, housing 12 can have diameter "D1" of about 20.8 mm, diameter "D2" can be about 19.3 mm. The length of tapered chamber 30 "L1" from entrance 34 to interior surface 36 of rear wall 18 shown in FIG. 3 can be 19.8 mm and chamber 30 can taper at an angle of about 2 degrees. The following dimensions of sleeve 14 for each of the 16 mm and 18 mm capacitors are the same except for diameter "D5" which can be about 17 mm for 18 mm diameter capacitors and about 15 mm for 16 mm diameter capacitors. Length "L3" of sleeve 14 from outside end 42 to insertion end 44 can be about 20 mm, length "L4" of sleeve 14 including plank 48 can be about 37.5 mm Another embodiment of housing 112 is shown in FIGS. 9 and 10. Housing 112 can have base wall 116 and rear wall 118 extending substantially perpendicular from base wall 116. Substantially cylindrical body portion 120 can join rear and base walls 116, 118, respectively. Termination support shelf 127 can extend from the rear wall 118. Four posts 122 can extend downward from base wall and have spacer portions 123 for elevating base wall 116 above PCB a predetermined distance and insertion portions 121 which can be received in holes (not shown) of a PCB and heat staked for secure mounting to the PCB as discussed above with respect to housing 12.

Figure 11:
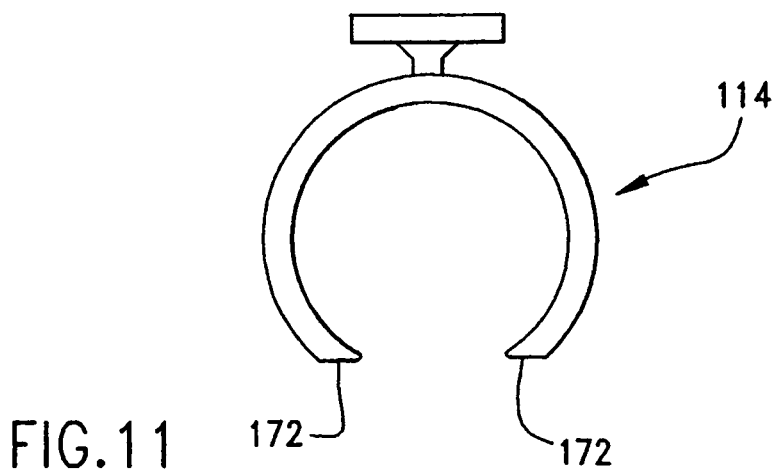
FIG. 11 is an elevation view of the front end of another embodiment of a sleeve of the electrical component mounting assembly of the present disclosure.

While housing 112 is substantially similar to housing 12 in many respects, one variation can be that substantially cylindrical tapered chamber 130 can have a flat base surface 170. This can assist in reducing the overall height of housing 112 to compensate somewhat for spacer portions 123. Another embodiment of sleeve 114 shown in FIG. 11 can have flat edges 172 to correspond to flat base surface 170 housing 112.

Figure 12:
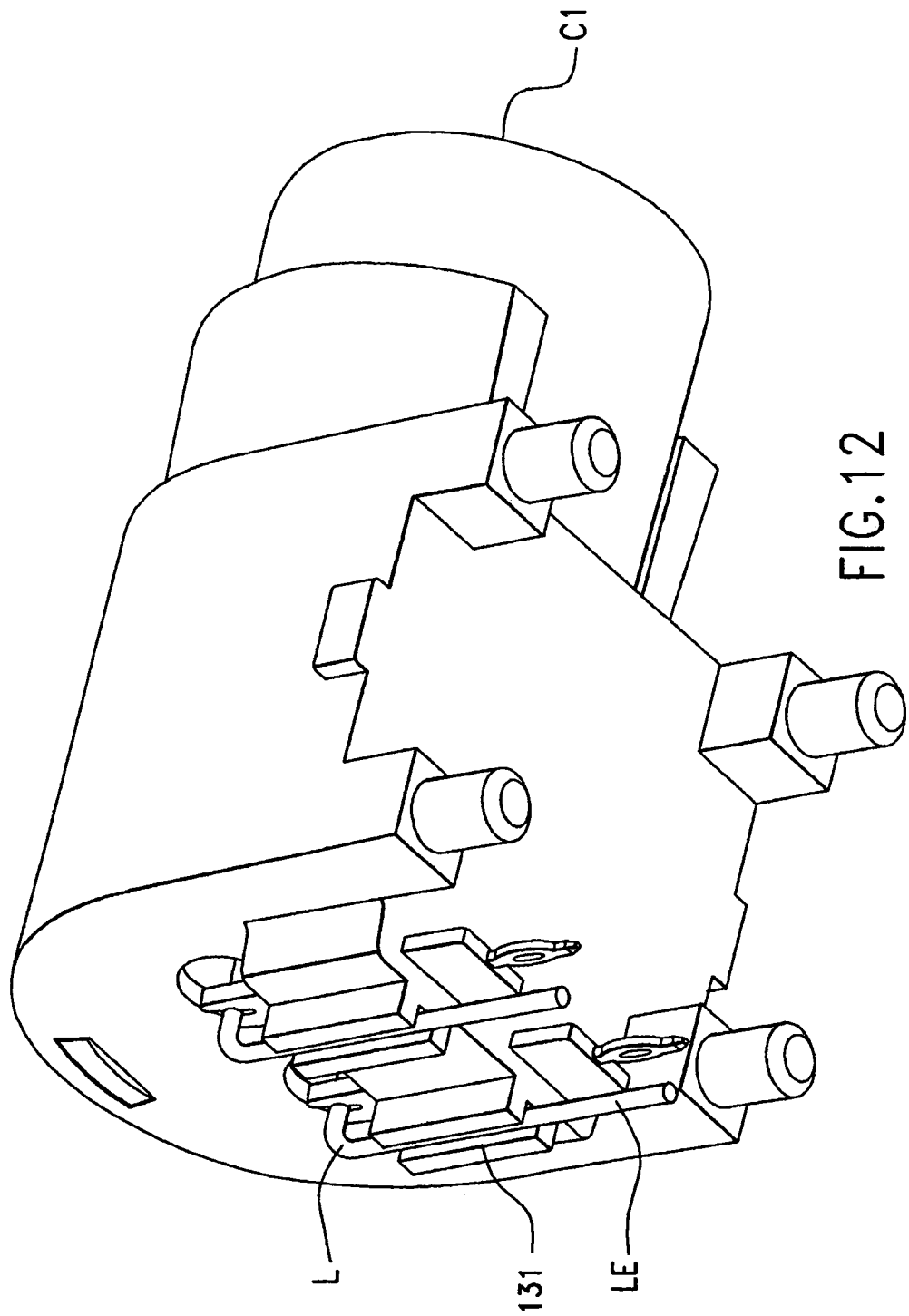
FIG. 12 is a perspective view of another embodiment of an electrical mounting assembly including the housing shown in FIG. 9 and the sleeve shown in FIG. 11.

Termination support shelf 127 of housing 112 shown in FIG. 12 can have extension clips 131. Lead extension "LE" can be supported in clips 131 and can be soldered to the PCB at one end and to leads "L" of capacitor "C1" at the other end. Alternatively, a mechanical connection can be used to connect leads "L" to lead extensions "LE" as shown in FIG. 4.

The process of mounting a capacitor to a PCB will now be described. Sacrificial key 54 of sleeve 14 is used to pick and place sleeve 14 on an assembly track. A capacitor is inserted into a preload position with sleeve 14. The preload position depends on the length of the electrical component to be mounted but, typically, sleeve 14 is positioned off-center towards the front end of the capacitor which is opposite the lead end (i.e. the end from which the leads extend) of the capacitor "C1". Housing 12 is inserted over the sleeve 14 and capacitor "C1" until lead end of capacitor "C1" contacts interior surface 36 of rear wall 18 (FIG. 3). The tapered outer surface 28 of sleeve 14 should not, at this point, fully lock with tapered chamber 30. If this occurs, sleeve 14 should be positioned further off-center towards front end of capacitor "C1". Sleeve 14 can then be pushed into housing 12 to engage taper lock between outer surface 28 and chamber 30. Plank 48 can be cut and heat staked to housing 12. Depending on the type of electrical connection to be made between leads "L" and the PCB or other mounting member terminals "T" can be inserted into slots 29 prior to placing sleeve 14 and capacitor "C1" into the housing. Then after the taper lock is engaged and capacitor "C1" is secured to housing 12, leads "L" can be mechanically connected to lead clips "LC" of terminals "T" or lead extensions "LE" can be soldered to leads "L" and clipped to extension clips 31. Sacrificial key 54 can then be removed.

While the present disclosure has been described in detail with reference to the foregoing embodiments, other changes and modifications may still be made without departing from the spirit or scope of the present disclosure. It is understood that the present disclosure is not to be limited by the embodiments described herein. Indeed, the true measure of the scope of the present disclosure is defined by the appended claims including the full range of equivalents given to each element of each claim.

What is claimed is:

1. An electrical component mounting assembly for mounting an electrical component to a printed circuit board, comprising:
   a housing having means for supporting and fixing the housing to a printed circuit board, and a sleeve for accommodating the electrical component,
   wherein the housing includes a chamber for receiving the sleeve, characterized in that the chamber is tapered from an open end to a back end, and in that
   a plurality of sleeves is provided, each dimensioned to accept one of a plurality of unique diameter electrical components, each sleeve having an outer surface tapered to be inserted into the open end of the tapered chamber, each sleeve also having an inner surface to provide a substantially uniform cylindrical receiving passage for receiving the respective electrical components,
   wherein progressive insertion of the sleeve into the tapered chamber causes the sleeve to compress against the unique diameter cylindrical electrical component and its associated sleeve to the housing.

2. The electrical component mounting assembly of claim 1 wherein the cylindrical electrical component is an electrolytic capacitor.

3. The electrical component mounting assembly of claim 1 wherein the substantially uniform cylindrical passage has a diameter less than the diameter of the unique diameter component and the tapered sleeve has a slot extending from a first end to the second end to facilitate flexing of the sleeve to snugly receive the unique diameter component.

4. The electrical component mounting assembly of claim 3 wherein
   (i) the diameter at the open end of the tapered chamber is greater than the diameter at the back end of the tapered chamber,
   (ii) the diameter taken at the outer surface of the first end of the associated sleeve is greater than the diameter of the open end of the chamber, and
   (iii) the diameter taken at the outer surface of the second end of the associated sleeve is less than the diameter of the open end of the chamber and greater than the diameter of the back end of the chamber.

5. The electrical component mounting assembly of claim 4 wherein the sleeve extends about a first central axis and the outer surface of the sleeve tapers at an angle in a range from 1.5 to 3.0 degrees relative to the first central axis, and the tapered chamber extends about a second central axis and the tapered chamber tapers at an angle in a range from 1.5 to 3.0 degrees relative to the second central axis.

6. The electrical component mounting assembly of claim 5 wherein the housing has a rear wall adjacent the back end of the tapered chamber and the rear wall has at least one hole to accept one or more leads of the electrical component and further includes a slit to receive a plank extending from the second end of the sleeve for heat staking the sleeve to the housing.

7. The electrical component mounting assembly of claim 6 wherein the Plank is positioned on a side of the sleeve opposite the slot.

8. The electrical component mounting assembly of claim 1 wherein the supporting and fixing means of the housing includes a base having a plurality of posts for insertion into respective receiving openings of the PCB to mount the housing to the PCB wherein each of the plurality of posts includes an insertion portion and a spacer portion between the insertion portion and the base for elevating the base a predetermined distance from the printed circuit board when the insertion portion is received in the receiving openings of the printed circuit board, 9. The electrical component mounting assembly of claim 8 wherein each of the plurality of posts constitute a latch bar including a hook portion to prevent disengagement of the housing from the PCB after said hook portion is inserted in its respective receiving opening and each of the insertion portions is heat stackable to prevent disengagement of the housing from the PCB after it is inserted into its respective receiving opening and heat staked.

10. The electrical component mounting assembly of claim 1 wherein the housing includes a terminal support member positioned on an outside surface of the rear wall for supporting a terminal connected at one end to a component lead and connected to the PCB at another end.

11. The electrical component mounting assembly of claim 10 wherein the terminal support member includes two slots and a terminal received in each of the two slots, each terminal has a clip end for connection to a component lead and a compliant push pin tip on the opposite end for connection to the PCB.

12. The electrical component mounting assembly of claim 1 wherein the central axis of the tapered chamber extends parallel to the PCB when the housing is mounted to the PCB.

13. The electrical component mounting assembly of claim 1 wherein the tapered chamber has a frusto-conical shape dimensioned to separately accept any one of a plurality of electrical components having different diameters and their associated sleeves.

14. The electrical component mounting assembly of claim 1 where the housing has a generally cylindrical retention area; said retention area having a generally cylindrical body portion extending around a central axis and a generally flat base along one side of said body portion; said housing having an open front end to receive said electrical component and an opposite back end.

15. A method of mounting, to a printed circuit board, any one of a plurality of cylindrical electrical components each having a unique diameter, comprising the steps of:
   a) providing an electrical component mounting assembly including a housing having a tapered chamber,
   b) providing a plurality of sleeves each having an outer surface tapered inward from a first end to a second and conforming to the taper of the chamber, and an inner surface defined by as uniform passage dimensioned to accept one of the plurality of unique diameter electrical components,
   c) electinig a sleeve adapted to as respective unique diameter electrical component,
   d) inserting the electrical component in the passage of any one of a plurality of cylindrical sleeves,
   e) inserting the elected sleeve having the electrical component received therein, second end first, into said tapered chamber of said housing to engage a friction fit taper lock between the tapered outer surface of the sleeve and the tapered chamber, the tapered chamber, and
   f) inserting a plurality of posts of the housing into respective receiving openings of the printed circuit board.

* * * * *